United States Patent
Savary et al.

(10) Patent No.: US 12,040,754 B2
(45) Date of Patent: Jul. 16, 2024

(54) AMPLIFIER CIRCUIT WITH AN OUTPUT LIMITER

(71) Applicant: NXP USA, INC., Austin, TX (US)

(72) Inventors: Pierre Pascal Savary, Muret (FR); Stephane Damien Thuriés, Saubens (FR)

(73) Assignee: NXP USA, Inc., Austin, TX (US)

( * ) Notice: Subject to any disclaimer, the term of this patent is extended or adjusted under 35 U.S.C. 154(b) by 383 days.

(21) Appl. No.: 17/349,096

(22) Filed: Jun. 16, 2021

(65) Prior Publication Data
US 2021/0408974 A1 Dec. 30, 2021

(30) Foreign Application Priority Data
Jun. 26, 2020 (EP) .................................. 20305714

(51) Int. Cl.
*H03F 1/02* (2006.01)
*G01S 7/03* (2006.01)
(Continued)

(52) U.S. Cl.
CPC ............. *H03F 1/565* (2013.01); *G01S 7/03* (2013.01); *H03F 1/0233* (2013.01); *H03F 3/195* (2013.01);
(Continued)

(58) Field of Classification Search
CPC ........ H03F 1/565; H03F 1/0233; H03F 3/195; H03F 3/45475; H03F 2200/129;
(Continued)

(56) References Cited

U.S. PATENT DOCUMENTS 6,714,081 B1  3/2004  Xu
6,887,339 B1  5/2005  Goodman et al.
(Continued)

FOREIGN PATENT DOCUMENTS

CN    102075148 A    5/2011
EP     1480332 A2    11/2004
(Continued)

OTHER PUBLICATIONS

U.S. Appl. No. 17/349,081 and Preliminary Amendment filed on Jun. 16, 2021 and entitled "Amplifier Circuit With Temperature Compensation".
(Continued)

*Primary Examiner* — Andrea Lindgren Baltzell
*Assistant Examiner* — Khiem D Nguyen

(57) ABSTRACT

An amplifier circuit comprising:
an amplifier;
an output limiter for providing a variable impedance comprising:
a first and second limiter terminal; a transistor comprising a conduction channel; a first resistor coupled in parallel with the conduction channel; and a capacitor coupled in series with the conduction channel between the conduction channel and the first or second limiter terminal; and
a feedback control unit comprising a comparator block configured to provide a control signal to the output limiter based on a comparison of the amplifier output signal and a setting voltage;
wherein: the first limiter terminal is coupled to the amplifier input or output; the second limiter terminal receives a reference voltage; and wherein receipt of the control
(Continued)

signal at the transistor provides for a variable impedance for the amplifier circuit dependent on the amplifier output signal.

20 Claims, 3 Drawing Sheets

(51) Int. Cl.
    *H03F 1/56*     (2006.01)
    *H03F 3/195*     (2006.01)
    *H03F 3/45*     (2006.01)
    *G01S 13/931*     (2020.01)

(52) U.S. Cl.
    CPC ........ *H03F 3/45475* (2013.01); *G01S 13/931* (2013.01); *H03F 2200/129* (2013.01); *H03F 2200/451* (2013.01)

(58) Field of Classification Search
    CPC ......... H03F 2200/451; H03F 2200/258; H03F 3/45188; H03F 2200/211; H03F 2200/78; H03F 2200/99; H03F 1/523; H03F 3/193; H03F 3/245; G01S 13/931; G01S 7/03
    USPC .................................................. 330/144, 311
    See application file for complete search history.

(56) References Cited

U.S. PATENT DOCUMENTS

| | | | |
|---|---|---|---|
| 7,138,836 B2 | 11/2006 | Ajit et al. | |
| 8,279,008 B2 | 10/2012 | Hsieh et al. | |
| 8,653,892 B2 | 2/2014 | Wang et al. | |
| 8,729,962 B2 | 5/2014 | Lin et al. | |
| 9,419,565 B2 | 8/2016 | Nobbe et al. | |
| 9,755,581 B2 | 9/2017 | Khasnis et al. | |
| 9,912,300 B2 | 3/2018 | Harasawa et al. | |
| 11,177,777 B2 | 11/2021 | Yamashiro | |
| 2003/0112078 A1 | 6/2003 | Rategh et al. | |
| 2005/0208909 A1 | 9/2005 | Maya et al. | |
| 2010/0060357 A1 | 3/2010 | Drogi et al. | |
| 2013/0033327 A1 | 2/2013 | Kadoi et al. | |
| 2014/0253242 A1 | 9/2014 | Youssef et al. | |
| 2016/0344350 A1 | 11/2016 | Khasnis, et al. | |
| 2018/0034426 A1 | 2/2018 | Tabei et al. | |
| 2018/0152151 A1 | 5/2018 | Harasawa et al. | |
| 2018/0198429 A1 | 7/2018 | Tabei et al. | |

FOREIGN PATENT DOCUMENTS

| | | |
|---|---|---|
| GB | 2123231 A | 1/1984 |
| JP | 2014192805 A | 10/2014 |

OTHER PUBLICATIONS

Non-final office action dated Feb. 14, 2024 in U.S. Appl. No. 17/349,081.

Non-final office action dated May 31, 2024 in U.S. Appl. No. 17/349,081.

Electronic Design, "super beta fully differential amplifiers launch new era of precision", https://www.electronicdesign.com/technologies/analog/article/21156842/texas-instruments, Mar. 2021.

AMPLIFIER CIRCUIT WITH AN OUTPUT LIMITER

CROSS-REFERENCE TO RELATED APPLICATIONS

This application claims the priority under 35 U.S.C. § 119 of European Patent application no. 20305714.6, filed on 26 Jun. 2020, the contents of which are incorporated by reference herein.

FIELD

The present disclosure relates to an amplifier circuit and, in particular, to an amplifier circuit including an output limiter and feedback control unit for controlling the amplifier based on an amplifier output signal. It also relates to an automotive radar transceiver including such an amplifier circuit.

BACKGROUND

The effective control of amplifier circuits can be a challenge. Hot carrier injection can lead to damage of amplifier circuits.

SUMMARY

According to a first aspect of the present disclosure there is provided an amplifier circuit comprising:
  an amplifier having an amplifier input terminal and an amplifier output terminal, the amplifier configured to provide an amplifier output signal at the amplifier output terminal based on an amplifier input signal received at the amplifier input terminal;
  an output limiter for providing a variable impedance comprising:
    a first limiter terminal, a second limiter terminal and an impedance control terminal;
    a transistor comprising a conduction channel and a transistor control terminal, wherein the transistor control terminal is coupled to the impedance control terminal;
    a first resistor, wherein the first resistor is coupled in parallel with the conduction channel of the transistor; and
    a capacitor coupled in series with the conduction channel of the transistor between the conduction channel of one of: (i) the first limiter terminal; and (ii) the second limiter terminal; and
  a feedback control unit having a first control unit input terminal coupled to the amplifier output terminal, a second control unit input terminal couplable to a setting voltage and a control unit output terminal coupled to the impedance control terminal wherein the feedback control unit comprises a comparator block configured to provide a control signal at the control unit output terminal based on a comparison of the amplifier output signal and the setting voltage;
  wherein:
    the first limiter terminal is coupled to one of: (a) the amplifier input terminal and (b) the amplifier output terminal;
    the second limiter terminal is for coupling to a reference node for receiving a reference voltage; and
    wherein receipt of the control signal at the transistor control terminal of the transistor provides for a variable impedance for the amplifier circuit dependent on the amplifier output signal.

In one or more embodiments, the feedback control unit is configured to provide the control signal at the control unit output terminal that decreases the variable impedance of the output limiter in response to the comparison between the amplifier output signal and the setting voltage having a difference or ratio exceeding a predetermined trigger point defined, at least in part, by the setting voltage.

In one or more embodiments, the comparator block includes negative feedback.

In one or more embodiments, the comparator block of the feedback control unit comprises an operational amplifier configured to provide the control signal at its output wherein a non-inverting input of the operational amplifier is coupled to the first control unit input terminal and an inverting input is coupled to the second control unit input terminal, and the operational amplifier is configured with negative feedback between the control unit output terminal and the inverting input.

It will be appreciated that the operational amplifier acts as a comparator with negative feedback.

In one or more embodiments, the amplifier circuit further comprises a programmable voltage source coupled to the second control unit input terminal and wherein the programmable voltage source is programmable to set the value of the setting voltage.

In one or more embodiments, the transistor of the output limiter is one of a MOSFET and a bipolar junction transistor.

In one or more embodiments, the capacitor is coupled between the first limiter terminal and the conduction channel of the transistor.

In one or more embodiments, the control unit output terminal is coupled to a first terminal of a feedback resistor and a second terminal of the feedback resistor is coupled to the second control unit input terminal.

In one or more embodiments, the output limiter includes a second resistor coupled between the transistor control terminal of the transistor and the impedance control terminal.

In one or more embodiments, the feedback control unit comprises a third resistor in series between the second control unit input terminal and the comparator block.

In one or more embodiments, the feedback control unit comprises a voltage detector configured to receive the AC output voltage of the amplifier output terminal and provide a non-alternating voltage to the comparator block.

In one or more embodiments, the feedback control unit is configured to provide a substantially constant control signal at the control unit output terminal in response to the comparison between the amplifier output signal and the setting voltage having a difference or ratio less than the predetermined trigger point defined, at least in part, by the setting voltage.

In one or more embodiments, the amplifier comprises a differential cascode amplifier wherein the differential cascode amplifier comprises:
  a first branch having a first end couplable to a first cascode reference node and a second end couplable to both a second cascode reference node and a cascode voltage source, the first branch further comprising:
    a first cascode transistor having a conduction channel and a control terminal, the conduction channel of the first cascode transistor couplable at a first terminal to the first cascode reference node;

a second cascode transistor having a conduction channel and a control terminal, the conduction channel of the second cascode transistor coupled at a first terminal in series with a second terminal of the conduction channel of the first cascode transistor; and a first output matching network portion, the first output matching network portion coupled at a first terminal to a second terminal of the conduction channel of the second cascode transistor and a second terminal of the first output matching network portion couplable to the second reference node;

a second branch having a first end couplable to the first cascode reference node and a second end couplable to the second cascode reference node, the second branch further comprising:

a third cascode transistor having a conduction channel and a control terminal, the conduction channel of the third cascode transistor couplable at a first terminal in series with the first cascode reference node;

a fourth cascode transistor having a conduction channel and a control terminal, the conduction channel of the fourth cascode transistor coupled at a first terminal in series with a second terminal of the conduction channel of the third cascode transistor; and a second output matching network portion, the second output matching network portion coupled at a first terminal to a second terminal of the conduction channel of the fourth cascode transistor and a second terminal of the second output matching network portion couplable to the second reference node, wherein the control terminals of the second and fourth cascode transistors are coupled together, wherein the control terminals of the first cascode transistor and the control terminal of the third cascode transistor is coupled to the amplifier input terminal, and wherein one of the first and second output matching network portions is coupled to the amplifier output terminal.

In one or more examples, the comparator block is configured to compare the AC output signal of the amplifier circuit with an AC setting voltage.

In one or more examples, the feedback control unit is configured to provide a control signal at the control unit output terminal that varies at a first rate with the amplifier output signal in response to the comparison between the amplifier output signal and the setting voltage having a difference or ratio less than the predetermined trigger point; and is configured to provide a control signal at the control unit output terminal that varies at a second rate with the amplifier output signal in response to the comparison between the amplifier output signal and the setting voltage having a difference or ratio greater than the predetermined trigger point, defined at least in part by the setting voltage. In one or more examples, the first rate may be zero (or less than a threshold) such that below the trigger point, there is no (or little) control of the output limiter.

In one or more embodiments, the first limiter terminal is coupled to an input matching network comprising:

an input matching network capacitor couplable at a first terminal to a voltage source;

an input matching network reference node couplable to a second terminal of the input matching network capacitor; and an input matching network inductance element coupled at a first terminal to the first terminal of the input matching network capacitor and a second terminal of the input matching network inductance element coupled to the amplifier input terminal.

According to a second aspect of the present disclosure there is provided an automotive radar transceiver comprising the amplifier circuit of the first aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

The performance of amplifiers, such as those incorporated in CMOS based transceivers, can vary based on many factors. For example, the gain of amplifiers can vary with temperature and fabrication process variations, leading to variations in the way an input signal is amplified along a signal path of the amplifier. These variations can cause suboptimal control of the amplifier in use and even degradation of the circuit due to hot carrier injection (HCI) if the signal amplitude at the output becomes too high.

In some applications, such as millimetre wave CMOS transceivers used in automotive radar devices, several amplifiers may be used in each of a transmit path and a receive path of the transceiver. Amplifiers in such systems may experience gains of 20 dB to 40 dB over a temperature change from −40 Celsius to +125 Celsius. In such cases, an accurate level control may be particularly difficult to implement.

The amplifier circuit according to the present disclosure provides for control of the AC voltage of the amplifier output signal of the amplifier. The control is provided by a feedback control unit that compares the voltage output of the amplifier with a reference setting voltage (e.g. the detected AC voltage of the output of the amplifier, converted into DC, and compared with the reference setting voltage) and, based on the comparison, controls an output limiter by control of an impedance value of a variable impedance thereof that is coupled to the input of the amplifier or to the output of the amplifier. The feedback control unit therefore provides for the limiting of the AC output voltage (e.g. not the DC output voltage which may be controlled by a bias circuit) based on a reference, setting voltage and has been found to provide for particularly precise and effective control of the output signal level. The provision of such a feedback control unit and output limiter, that is distinct from a bias circuit of said amplifier, has been found, in one or more examples, to effectively control the AC voltage component at the output of the amplifier circuit.

Amplifiers and, in particular, CMOS integrated circuits including said amplifiers, are known to be sensitive to hot carrier injection (HCI) degradation. In some embodiments, an amplifier configured to be in receipt or detection of millimetre wave signals may particularly benefit from the amplifier output controller 100 disclosed herein. In one or more embodiments, an amplifier comprising a differential cascode amplifier may benefit from the amplifier output controller 100, as described herein, where separate amplifier output controllers 100 are coupled to either one of or both of the amplifier input terminals or to one or both of the amplifier output terminals.

Figure 1:
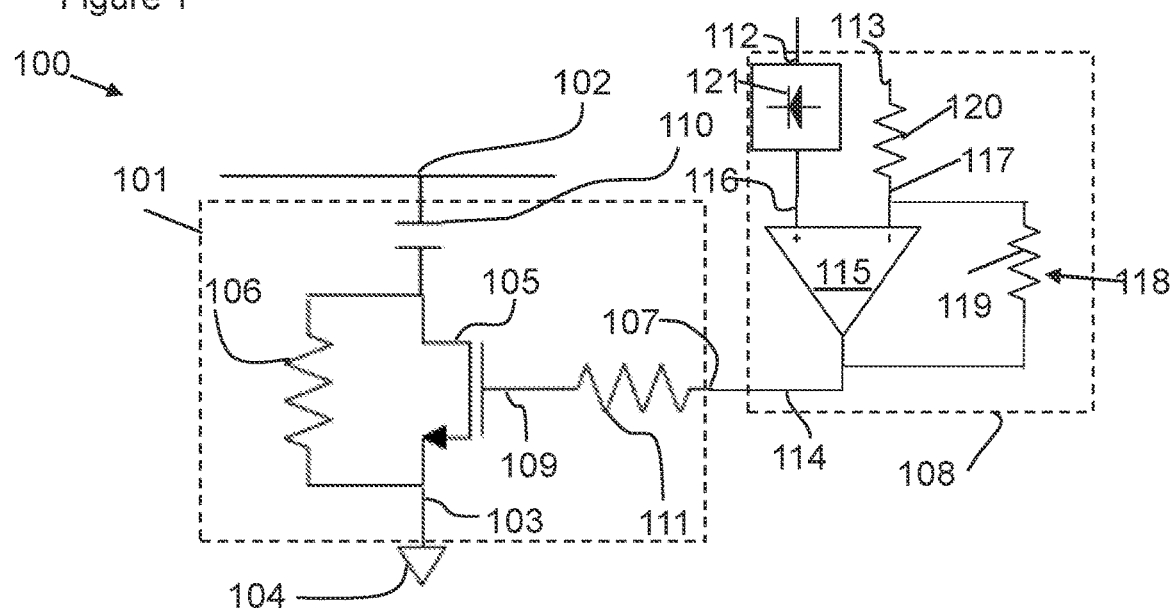
FIG. 1 shows an example embodiment of an output limiter and a feedback control unit.

FIG. 1 shows an amplifier output controller 100 according to the present disclosure comprising an output limiter 101 and a feedback control unit 108. The output limiter 101 comprises a first terminal 102 configured to be coupled to either an amplifier input terminal (show in FIG. 3) or an amplifier output terminal (shown in FIG. 4) of an amplifier (shown in FIGS. 2, 3 and 4), wherein the amplifier 212, the output limiter 101 and the feedback control unit 108 together provide an amplifier circuit. It has been found that control of the AC voltage of the amplifier input signal to the amplifier by the output limiter 101 may be provided by the feedback control unit 108 being configured to be coupled to an amplifier output terminal of the amplifier. In a further embodiment, similar control is provided by the output limiter 101 being coupled to the amplifier output terminal.

The output limiter 101 also comprises a second terminal 103, wherein the second terminal 103 is configured to be coupled to a reference node 104. The reference node 104 may be a node which is set to a reference voltage, such as a ground node set to a relative 0 V. It will be appreciated, however, that the reference node 104 may be set to any suitable reference voltage.

Any reference node referred to herein may comprise a ground node set to a relative 0 volts. Any reference node may be set to a same relative voltage as one or more of the other reference nodes, or one or more reference nodes may be set to different reference voltages, as is appropriate to enable operation of the amplifier circuit in the described manner. It will further be appreciated that, typically, reference nodes, such as a ground node, are only considered coupled to ground when the amplifier circuit is coupled to a power source. As such, references to terminals being couplable to ground are understood by the skilled person as being a clear reference that such an amplifier circuit does not need to be coupled to a power source to be an amplifier circuit according to the present disclosure but is configured to be so coupled in use.

The output limiter 101 also comprises a transistor 105 comprising a conduction channel and a control terminal 109. The transistor 105 may be any suitable transistor such as, by way of non-limiting example, a metal-oxide-semiconductor field-effect transistor (MOSFET) or a bipolar junction transistor (BJT). In some embodiments, because the MOSFET does not need a gate current, the use of a MOSFET may provide for a less complex circuit design. It will be appreciated that, while different types of transistors use different nomenclature for their various terminals, and some transistors have additional terminals, a common feature of transistors is the presence of a conduction channel which can act as a switch or variable resistor controlled by a voltage applied at a control terminal. In some examples the control terminal may comprise a base or a gate. In some examples, the terminals of the conduction channel may comprise a collector and an emitter or a source and a drain.

The output limiter 101 may comprise a first resistor 106 connected in parallel with the conduction channel of the transistor 105. The first resistor 106 may be a discrete resistor component. The first resistor 106 in combination with the transistor 105 provide a variable impedance which is controlled by the voltage received at the control terminal 109 of the transistor 105. To a first order, the variable impedance provided by the first resistor 106 and the transistor 105 may be approximated as a variable resistor. In particular, the first resistor 106 may be configured to keep the voltage across the conduction channel (e.g. $V_{DS}$) of the transistor 105 substantially equal to zero.

The output limiter 101 further comprises an impedance control terminal 107 coupled to the transistor control terminal 109. The variable impedance unit control terminal is configured to receive a control signal that is based on the output AC voltage of the amplifier relative to a reference, setting DC voltage, as will be explained below. By providing a signal at the transistor control terminal 109 that is dependent on the output AC voltage of the amplifier relative to a setting voltage, the variable impedance provided by the combination of the first resistor 106 and the transistor 105 is made voltage limiting in its control of the alternating component of the output of the amplifier. In this way, the output limiter 101 may, in one or more examples, attenuate the amplifier input or output signal level in such a way as to limit the effect of HCI. It will be appreciated that HCI may occur when the $V_{DS}$ voltage of the amplifier, either DC or RF (i.e. AC), exceeds a particular value. The proposed output limiter 101 limits the $V_{DS}$ AC voltage using a control loop that regulates the output level by acting either on the input signal amplitude or output signal amplitude.

Thus, the output limiter 101 acts to attenuate the voltage of the amplifier input signal or the amplifier output signal. Further, it has been found that the output limiter 101 may provide for improved reliability of level control by creating losses in the amplifier input signal or output signal as opposed to providing for compensation using a bias DC signal applied to the amplifier that may be sensitive to self-biasing.

The output limiter 101 further comprises a capacitor 110 connected in series with the conduction channel of the transistor 105 between the conduction channel and one of the first limiter terminal 102 and the second limiter terminal 103 of the temperature dependent variable impedance unit 101. In the embodiments shown herein, the capacitor 110 is coupled between the conduction channel and the first limiter terminal 102 and in series with the first resistor 106 and therefore not part of the parallel arrangement with the transistor 105 and first resistor 106. The capacitor 110 may be configured to provide for blocking DC components of signals from the amplifier input terminal or the amplifier output terminal. It will be appreciated that the voltages used for the control signal may be different depending on whether the capacitor 110 of the temperature dependent variable impedance unit is coupled between the amplifier input or output terminal and the conduction channel or between the conduction channel and the reference node 104.

As shown in FIG. 1, the amplifier output controller comprises a feedback control unit 108. The feedback control unit 108 has a first control unit input terminal 112 configured to be coupled to the amplifier output terminal 214 (shown in FIG. 2). The first control unit input terminal 112 is therefore configured to receive the amplifier output signal that is amplified by said amplifier. The feedback control unit 108 includes a second control unit input terminal 113 configured to be coupled to a node for receipt of the setting DC voltage. The setting voltage may be adjustable. The setting voltage may define a voltage level of the amplifier output signal at which the limiting behaviour of the output limiter 101 is provided by its variable impedance (and therefore, otherwise, not provided). The amplifier circuit may comprise a programmable voltage source coupled to the second control unit input terminal 113 and wherein the programmable voltage source is programmable to set the value of the setting voltage. The feedback control unit 108 further comprises a control unit output terminal 114 coupled to the impedance control terminal 107 wherein the feedback control unit 108 comprises a comparator block 115 configured to provide a control signal at the control unit output terminal 114 based on a comparison of the amplifier output signal and the setting voltage.

The output limiter 101 may further comprise a second resistor 111, wherein the control terminal 109 of the transistor 105 is coupled to the impedance control terminal 107 via the second resistor 111. That is, the second resistor 111 may comprise a first terminal coupled to the transistor control terminal 109. The second resistor 111 may further comprise a second terminal coupled to the impedance control terminal 107 which is configured to receive the control signal. The second resistor 111 may be configured to reduce or mask the impact of parasitic capacitances from the feedback control unit 108 on the transistor control terminal 109. Reduced impact of parasitic capacitances may be provided as a result of the second resistor 111 having a high impedance relative to the impedance of the feedback control unit. For example, the impedance of the second resistor 111 may be 2, 5, 10, 50 or 100 times greater than the impedance of the feedback control unit 108. The skilled person will appreciate how to choose a suitable resistance to obtain a balance between masking the impact of the parasitic capacitances of the feedback control unit while not generating excessive parasitic capacitance of its own.

In use, receipt of the control signal at the transistor control terminal 109 of the transistor 105 provides for a variable impedance for the amplifier circuit dependent on the amplifier output signal. In particular, the control signal may be dependent on the amplifier output signal exceeding a threshold defined by the setting voltage and the impedance for the amplifier circuit may be configured to change its impedance in response. This may provide for effective limiting of the negative effects of HCI. Thus, the output limiter 101 may provide for limitation of the AC output voltage in order to reduce the likelihood of hot carrier injection (HCI) damage to transistors of the amplifier.

In one or more examples, the feedback control unit 108 is configured to trigger the operation of output limiter 101 to change its variable impedance based on the voltage of the amplifier output signal received via the first control unit input terminal exceeding a predetermined trigger level defined by the setting voltage provided at the second control unit input terminal 113.

In particular, the feedback control unit 108 may be configured to provide a control signal at the control unit output terminal 114 that provides for the decreasing of the variable impedance of the output limiter 101 in response to the comparison between the amplifier output signal and the setting voltage having a difference or ratio exceeding a predetermined trigger level.

Figure 5:
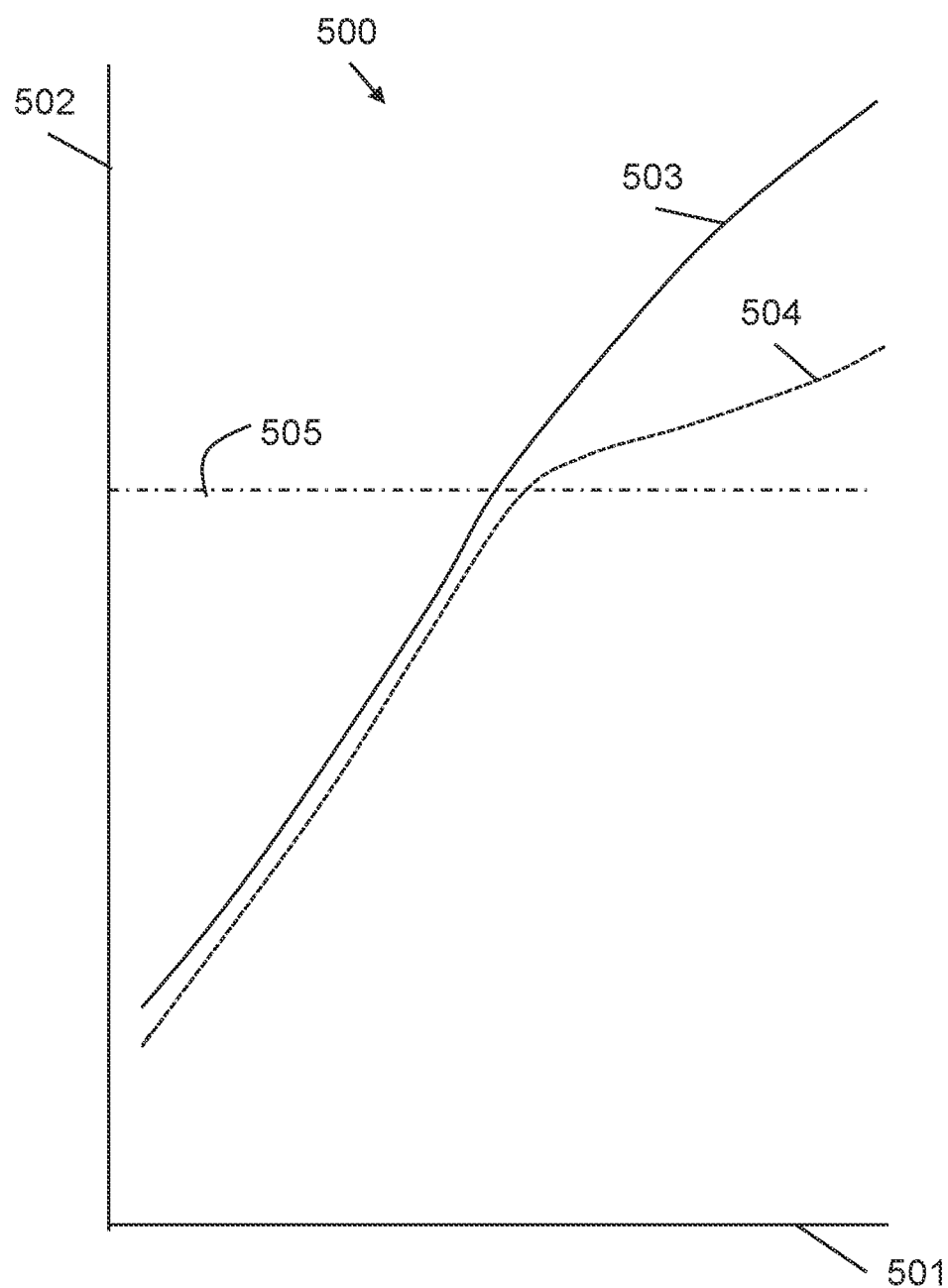
FIG. 5 shows an example graph illustrating the performance of the output limiter and a feedback control unit.

FIG. 5 shows a graph 500 illustrating the operation of the output limiter 101 and feedback control unit 108. The x-axis 501 shows the AC input voltage level to the amplifier circuit. The y-axis 502 shows the magnitude of the amplifier circuit's AC output voltage. The line 505 shows the predetermined trigger level defined by the setting voltage. Plot 503 shows the response of the amplifier arrangement 200 without the amplifier output controller 100. Plot 504 shows the response of the amplifier arrangement 200 with the amplifier output controller 100. Thus, at the trigger point, the variable impedance of the output limiter acts to limit the amplifier output voltage. Below the trigger level 505, i.e. when the ratio between the amplifier output voltage and the setting voltage is lower or the amplifier output voltage is less than the setting voltage plus or minus a predetermined amount, there may be no control (e.g. a constant control signal or a lower rate of control) of the variable impedance. Above the trigger level 505, i.e. when the ratio between the amplifier output AC voltage and the setting DC voltage is higher or the amplifier output voltage is greater than the setting voltage plus or minus a predetermined amount, there may be control of the variable impedance, such as to decrease its impedance (or a greater rate of control in response to the amplifier output signal, that is, a greater rate of decrease in impedance for increasing AC output voltage of the amplifier circuit).

In one or more examples, the comparator block 115 of the feedback control unit 108 comprises an operational amplifier configured to provide the control signal at its output wherein a non-inverting input 116 of the operational amplifier is coupled to the first control unit input terminal 112 and an inverting input 117 is coupled to the second control unit input terminal 113, and the operational amplifier is configured with negative feedback 118 between the control unit output terminal 114 and the inverting input 117.

It will be appreciated that the operational amplifier may act as a comparator with negative feedback.

The negative feedback may be provided by the control unit output terminal 114 being coupled to the second control unit input terminal 113. In one or more examples, control unit output terminal 114 is coupled to a first terminal of a feedback resistor 119 and a second terminal of the feedback resistor 119 is coupled to the second control unit input terminal 113.

The feedback control unit 108 may comprise a third resistor 120 in series between the second control unit input terminal 113 and the comparator block 115. The feedback control unit 108 may further comprises a voltage detector, coupled to the comparator block 115. The voltage detector may be configured to provide a DC representation of the AC output voltage to the comparator block 115, e.g. act as a rectifier. The voltage detector may provide for voltage level adjustment to provide a voltage of a suitable level to the comparator block. The voltage detector may comprise one or more diodes and, optionally, one or more capacitors and resistors, to implement the rectification and any level adjustment. The comparator block may therefore be configured to compare two DC voltages or, in other examples not shown in the figures, two AC voltages. It will be appreciated that the voltage detector could be implemented as one or more other components, which would be understood by those skilled in the art. It will also be appreciated that the feedback control unit 108 may be implemented in a differential amplifier circuit. In such an arrangement, the voltage detector may have two AC inputs for coupling to the two differential output lines of the differential amplifier circuit and one DC output for coupling to the comparator block 115. Also, in the case of a differential amplifier circuit, the feedback control unit 108 may provide its control signal to two output limiters 101, wherein the respective first limiter terminals 102 are for coupling to the respective differential input lines of the amplifier circuit or the respective differential output lines of the amplifier circuit.

Figure 2:
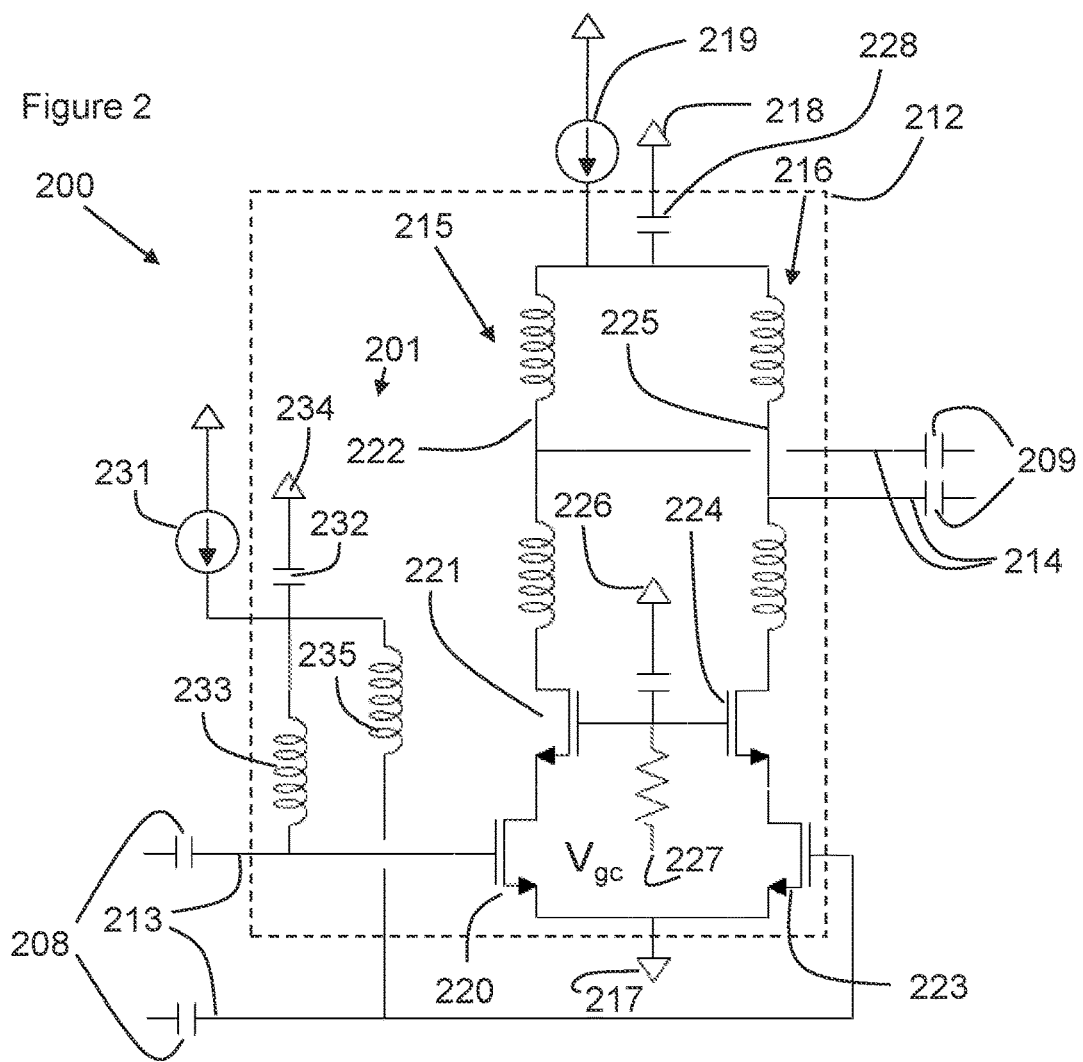
FIG. 2 shows an example amplifier with which the output limiter and the feedback control unit may be coupled.

FIG. 2 shows an example amplifier arrangement 200, with which the amplifier output controller 100 may be incorporated. In FIG. 2, the amplifier output controller 100 is not shown and, instead, the location of the amplifier output controller 100 in the amplifier arrangement 200 is shown in the simplified examples of FIGS. 3 and 4. It will be appreciated that the amplifier of FIG. 2 is only an example of an amplifier structure.

FIG. 2 shows an example amplifier arrangement 200 comprising an amplifier 212 having an amplifier input terminal 213 and an amplifier output terminal 214. In the example of FIG. 2, the amplifier 200 comprises two amplifier input terminals 213 and two amplifier output terminals 214, but in other amplifiers, only one amplifier input terminal 213 and one amplifier output terminal 214 may be provided. The or each amplifier input terminal 213 may comprise a corresponding input capacitor 208 connected in series with the amplifier input terminal 213. Similarly, the or each amplifier output terminal 214 may comprise a corresponding output capacitor 209 connected in series with the amplifier output terminal 214.

In the example of FIG. 2, the amplifier 212 comprises a differential cascode amplifier. The differential cascode comprises a first branch 215 and a second branch 216, each of the first branch 215 and second branch 216 having a first end and a second end. The first ends of the first branch 215 and the second branch 216 are connectable to a first cascode reference node 217 and the second ends of the first branch 215 and the second branch 216 are connectable to both a second cascode reference node 218, through the capacitor 228, and a cascode voltage source 219. The first and second cascode reference nodes 217, 218 may comprise ground and may be set to a relative voltage of zero or may have another reference voltage value.

The first branch 215 of the differential cascode amplifier 200 may comprise a first cascode transistor 220 having a conduction channel and a control terminal where the conduction channel of the first cascode transistor 220 is couplable at a first terminal in series with the first cascode reference node 217, that is, with the first end of the first branch 215. The control terminal of the first cascode transistor may be coupled to an input terminal 213 of the amplifier 212. The first branch 215 may further comprise a second cascode transistor 221 having a conduction channel and a control terminal, wherein the conduction channel of the second cascode transistor 221 is coupled at a first terminal in series with a second terminal of the conduction channel of the first cascode transistor 220.

The first branch 215 may further comprise a first output matching network portion 222, the first output matching network portion 222 coupled at a first terminal to a second terminal of the conduction channel of the second cascode transistor 221 and a second terminal of the first output matching network portion 222 couplable to the second reference node 218 through the output matching network capacitor 228.

The second branch 216 of the differential cascode amplifier 200 may comprise a third cascode transistor 223 having a conduction channel and a control terminal where the conduction channel of the third cascode transistor 223 is couplable at a first terminal in series with the first cascode reference node 217, that is, with the first end of the second branch 216. The control terminal of the third cascode transistor 223 may be coupled to an input terminal 213. The second branch 216 may further comprise a fourth cascode transistor 224 having a conduction channel and a control terminal, wherein the conduction channel of the fourth cascode transistor 224 is coupled at a first terminal in series with a second terminal of the conduction channel of the third cascode transistor 223.

The second branch 216 may further comprise a second output matching network portion 225, the second output matching network portion 225 coupled at a first terminal to a second terminal of the conduction channel of the fourth cascode transistor 224 and a second terminal of the second output matching network portion 225 couplable to the second reference node 218 through the output matching network capacitor 228.

In the differential cascode amplifier 212 embodiment of FIG. 2, the control terminals of the second and fourth cascode transistors 221, 224 may be coupled together. The control terminals of the second and fourth cascode transistors 221, 224 may also be couplable to a common third cascode reference node 226 and a common cascode gate voltage source 227.

The first and second output matching network portions 222, 225 may together provide for an output matching network. One of the first and second output matching network portions 222, 225 may be coupled to the amplifier output terminal 214. As previously described, in some embodiments, such as in the differential cascode amplifier 200, the amplifier may comprise two amplifier output terminals and each of the first and second output matching network portions 222, 225 are coupled to a respective one of the amplifier output terminals 214. The first and second output matching network portions 222, 225 may each comprise first and second inductors arranged in series and where a first amplifier output terminal 214 is connected between the first and second inductors of the first branch 215 and a second amplifier output terminal 214 is connected between the first and second inductors of the second branch 216. In other embodiments, the inductors may be replaced with one or more transmission lines or the output matching network portions may comprise a combination of inductors and transmission lines. In other examples, the first and second output matching network portions may have different arrangements.

The amplifier arrangement may comprise an input matching network 201 coupled to the first input terminal(s) 213 of the amplifier 212. The input matching network 201 comprises a voltage source 231, wherein the voltage source 231 may be configured to provide a constant voltage.

The input matching network 201 may further comprise an input matching network capacitor 232 coupled at a first terminal to the voltage source 231. The input matching network capacitor 232 may be couplable at a second node of the input matching network capacitor 232 to an input matching network reference node 234. The first terminal of the input matching network capacitor 232 may be coupled to the first terminal of an input matching network inductor 233 where a second node of the input matching network inductor 233 is coupled to the amplifier input terminal 213. In the case of a differential amplifier, two input matching network inductors 233, 235, may be used, where each input matching network inductor is coupled to each of the first input terminals 213. The input matching network capacitor 232 input matching network inductors 233, 235 may together be part of a matching network for the input signal. The input matching network 230 may be configured to provide a voltage, $V_g$, from the voltage source 231 that is provided to the cascode gate through the input matching network inductors 233, 235. It will be appreciated that the voltage provided by the voltage source 231 may be different to that provided at the common cascode gate voltage source, $V_{gc}$. Further, the input matching network capacitor 232 and the input matching network inductor isolate the amplifier input terminal from the voltage source 231 and matches the input of the amplifier, so that it is part of the input matching network.

The amplifier output controller 100 may be suitable for providing output voltage control or "limitation" for an amplifier configured to receive an AC (e.g. RF) signal of substantially any frequency. The amplifier output controller 100 of the amplifier circuit may be particularly beneficial for mm-wave applications. The skilled person understands how to scale the components of the amplifier output controller, based on the present disclosure, to achieve the desired feedback compensation for the desired frequency of operation. The amplifier output controller 100 may be particularly suitable for use with an amplifier comprising a differential cascode amplifier. As such, the components of the amplifier 200 may be configured to amplify signals between 60-110 GHz. The components of the amplifier output controller 100 and the bias structure 201 may be configured to provide suitable operation in supporting the amplifier 212, 312 when receiving signals between 60-110 GHz. The components may particularly be configured to receive and process signals between 75-85 GHz or more particularly at substantially 77 GHz. It will be appreciated by a person skilled in the art that configuring the various components of the amplifier circuit to operate within certain frequency regimes may involve scaling the magnitudes of said components to suitable sizes, inductances, capacitances, resistances and other electrical characteristics to operate within the desired regime. It will be appreciated by a skilled person that just because components of another circuit may be connected in similar arrangements, if they are configured for operation of different technical uses, then they may not necessarily provide for the same technical effect as the circuits disclosed herein.

Figure 3:
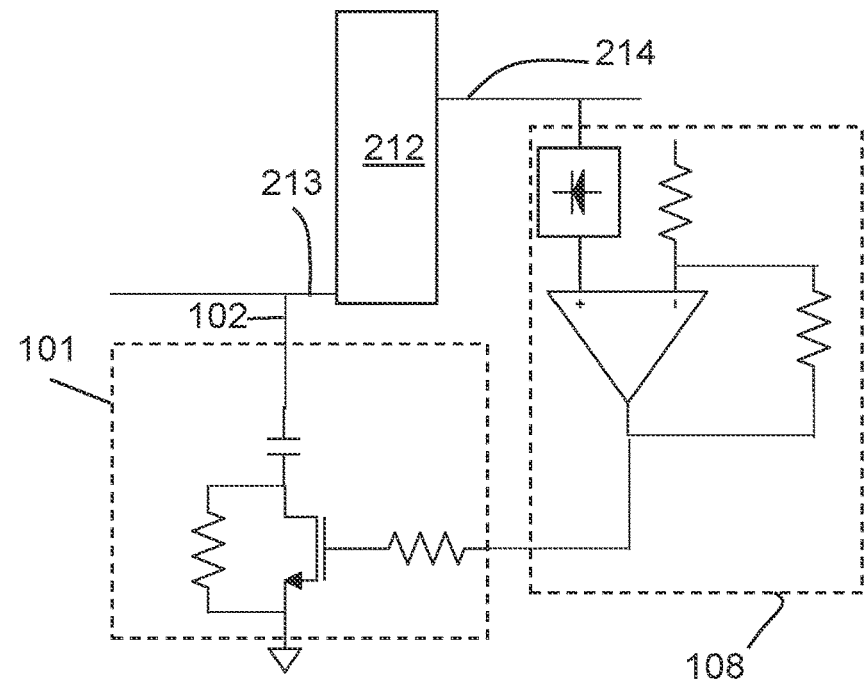
FIG. 3 shows a first example of the output limiter and feedback control unit coupled with said amplifier.
Figure 4:
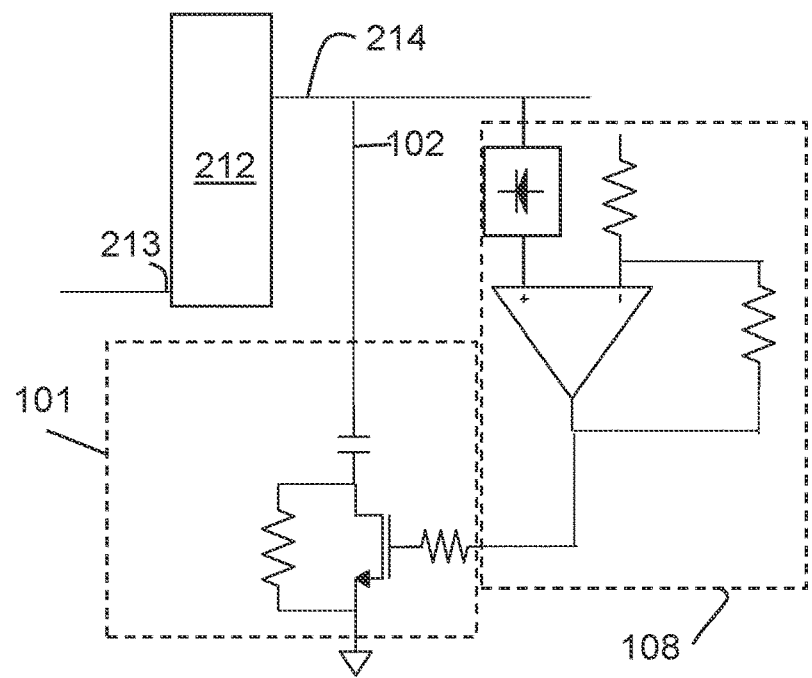
FIG. 4 shows a second example of the output limiter and feedback control unit coupled with said amplifier.

Example FIGS. 3 and 4 show examples of where the amplifier output controller 100 may be located relative to the amplifier 200

The examples show the amplifier 212 as a block having the amplifier input terminal 213 and the amplifier output terminal 214. In these simplified figures, there is only one amplifier input terminal 213 (which could represent the two lines of FIG. 2 in some examples). In these simplified figures, there is only one amplifier output terminal 214 (which could represent the two lines of FIG. 2 in some examples).

In example FIG. 3, the output limiter 101 is coupled to the amplifier input terminal 213 by the first limiter terminal 102. It will be appreciated that the output limiter 101 is coupled to the amplifier input terminal 213 separately from the inductor 233, 235 of the bias structure and would be in parallel therewith. The feedback control unit 108 is coupled to the amplifier output terminal 214 by the first control unit input terminal 112. As mentioned above, the feedback control unit 108 may be coupled to the differential output of the amplifier 212 wherein the voltage detector 121 is differential and is coupled to both differential lines.

Example FIG. 4 differs from the example FIG. 3 in that the output limiter 101 is coupled to the amplifier output terminal 213 by the first limiter terminal 102.

Figure 6:
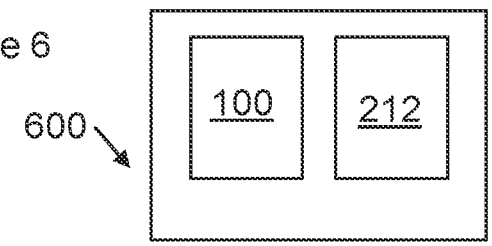
FIG. 6 shows an automotive radar transceiver.

Example FIG. 6 shows an automotive radar transceiver comprising the amplifier 212 and the amplifier output controller 100 coupled thereto.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details, it is intended that the following claims cover all possible example embodiments.

What is claimed is:

1. An amplifier circuit comprising:
   an amplifier having an amplifier input terminal and an amplifier output terminal, the amplifier configured to provide an amplifier output signal at the amplifier output terminal based on an amplifier input signal received at the amplifier input terminal;
   an output limiter for providing a variable impedance comprising:
      a first limiter terminal, a second limiter terminal and an impedance control terminal;
      a transistor comprising a conduction channel and a transistor control terminal, wherein the transistor control terminal is coupled to the impedance control terminal;
      a first resistor, wherein the first resistor is coupled in parallel with the conduction channel of the transistor; and
      a capacitor coupled in series with the conduction channel of the transistor between the conduction channel of one of: (i) the first limiter terminal; and (ii) the second limiter terminal; and
   a feedback control unit having a first control unit input terminal coupled to the amplifier output terminal, a second control unit input terminal couplable to a setting voltage and a control unit output terminal coupled to the impedance control terminal wherein the feedback control unit comprises:
      a comparator block configured to provide a control signal at the control unit output terminal based on a comparison of the amplifier output signal and the setting voltage; and
      a voltage detector having an input connected to the first control unit input terminal and an output connected to an input of the comparator block;
   wherein:
   the first limiter terminal is coupled to one of: (a) the amplifier input terminal and (b) the amplifier output terminal;
   the second limiter terminal is for coupling to a reference node for receiving a reference voltage; and
   wherein receipt of the control signal at the transistor control terminal of the transistor provides for a variable impedance for the amplifier circuit dependent on the amplifier output signal.

2. The amplifier circuit of claim 1 wherein the feedback control unit is configured to provide the control signal at the control unit output terminal that decreases the variable impedance of the output limiter in response to the comparison between the amplifier output signal and the setting voltage having a difference or ratio exceeding a predetermined trigger point defined, at least in part, by the setting voltage.

3. The amplifier circuit of claim 1 wherein the comparator block includes negative feedback.

4. The amplifier circuit of claim 1 wherein the comparator block of the feedback control unit comprises an operational amplifier configured to provide the control signal at its output wherein a non-inverting input of the operational amplifier is coupled to the output of the voltage detector and an inverting input is coupled to the second control unit input terminal, and the operational amplifier is configured with negative feedback between the control unit output terminal and the inverting input.

5. The amplifier circuit of claim 1 wherein the second control unit input terminal is configured to set the value of the setting voltage by way of a programmable voltage source.

6. The amplifier circuit of claim 1 wherein the transistor is one of a MOSFET and a bipolar junction transistor.

7. The amplifier circuit of claim 1 wherein the capacitor is coupled between the first limiter terminal and the conduction channel of the transistor.

8. The amplifier circuit of claim 1 wherein the control unit output terminal is coupled to a first terminal of a feedback resistor and a second terminal of the feedback resistor is coupled to the second control unit input terminal.

9. The amplifier circuit of claim 1, wherein the output limiter incudes a second resistor coupled between the transistor control terminal of the transistor and the impedance control terminal.

10. The amplifier circuit of claim 1 wherein the feedback control unit comprises a third resistor in series between the second control unit input terminal and the comparator block.

11. The amplifier circuit of claim 1 wherein the voltage detector is configured to receive the AC output voltage of the amplifier output terminal and provide a non-alternating voltage to the comparator block.

12. The amplifier circuit of claim 2 wherein the feedback control unit is configured to provide a substantially constant control signal at the control unit output terminal in response to the comparison between the amplifier output signal and the setting voltage having a difference or ratio less than the predetermined trigger point defined, at least in part, by the setting voltage.

13. The amplifier circuit of claim 1 wherein the amplifier comprises a differential cascode amplifier wherein the differential cascode amplifier comprises:
   a first branch having a first end couplable to a first cascode reference node and a second end couplable to both a second cascode reference node and a cascode voltage source, the first branch further comprising:
      a first cascode transistor having a conduction channel and a control terminal, the conduction channel of the first cascode transistor couplable at a first terminal to the first cascode reference node;
      a second cascode transistor having a conduction channel and a control terminal, the conduction channel of the second cascode transistor coupled at a first terminal in series with a second terminal of the conduction channel of the first cascode transistor; and
      a first output matching network portion, the first output matching network portion coupled at a first terminal to a second terminal of the conduction channel of the second cascode transistor and a second terminal of the first output matching network portion couplable to the second reference node;
   a second branch having a first end couplable to the first cascode reference node and a second end couplable to the second cascode reference node, the second branch further comprising:
      a third cascode transistor having a conduction channel and a control terminal, the conduction channel of the third cascode transistor couplable at a first terminal in series with the first cascode reference node;
      a fourth cascode transistor having a conduction channel and a control terminal, the conduction channel of the fourth cascode transistor coupled at a first terminal in series with a second terminal of the conduction channel of the third cascode transistor; and a second output matching network portion, the second output matching network portion coupled at a first terminal to a second terminal of the conduction channel of the fourth cascode transistor and a second terminal of the second output matching network portion couplable to the second reference node, wherein the control terminals of the second and fourth cascode transistors are coupled together, wherein the control terminals of the first cascode transistor and the control terminal of the third cascode transistor is coupled to the amplifier input terminal, and wherein one of the first and second output matching network portions is coupled to the amplifier output terminal.

14. The amplifier circuit of claim 13 wherein the first limiter terminal is coupled to an input matching network comprising:

an input matching network capacitor couplable at a first terminal to a voltage source;

an input matching network reference node couplable to a second terminal of the input matching network capacitor; and an input matching network inductance element coupled at a first terminal to the first terminal of the input matching network capacitor and a second terminal of the input matching network inductance element coupled to the amplifier input terminal.

15. An automotive radar transceiver comprising an amplifier circuit, the amplifier circuit comprising:

an amplifier having an amplifier input terminal and an amplifier output terminal, the amplifier configured to provide an amplifier output signal at the amplifier output terminal based on an amplifier input signal received at the amplifier input terminal;

an output limiter for providing a variable impedance comprising:

a first limiter terminal, a second limiter terminal and an impedance control terminal;

a transistor comprising a conduction channel and a transistor control terminal, wherein the transistor control terminal is coupled to the impedance control terminal;

a first resistor, wherein the first resistor is coupled in parallel with the conduction channel of the transistor; and a capacitor coupled in series with the conduction channel of the transistor between the conduction channel of one of: (i) the first limiter terminal; and (ii) the second limiter terminal; and a feedback control unit having a first control unit input terminal coupled to the amplifier output terminal, a second control unit input terminal couplable to a setting voltage and a control unit output terminal coupled to the impedance control terminal wherein the feedback control unit comprises:

a comparator block configured to provide a control signal at the control unit output terminal based on a comparison of the amplifier output signal and the setting voltage;

a voltage detector having an input connected to the first control unit input terminal and an output connected to an input of the comparator block;

wherein:

the first limiter terminal is coupled to one of: (a) the amplifier input terminal and (b) the amplifier output terminal;

the second limiter terminal is for coupling to a reference node for receiving a reference voltage; and wherein receipt of the control signal at the transistor control terminal of the transistor provides for a variable impedance for the amplifier circuit dependent on the amplifier output signal.

16. The automotive radar transceiver of claim 15, wherein the feedback control unit is configured to provide the control signal at the control unit output terminal that decreases the variable impedance of the output limiter in response to the comparison between the amplifier output signal and the setting voltage having a difference or ratio exceeding a predetermined trigger point defined, at least in part, by the setting voltage.

17. The automotive radar transceiver of claim 15, wherein the comparator block includes negative feedback.

18. The automotive radar transceiver of claim 15, wherein the comparator block of the feedback control unit comprises an operational amplifier configured to provide the control signal at its output wherein a non-inverting input of the operational amplifier is coupled to the first control unit input terminal and an inverting input is coupled to the second control unit input terminal, and the operational amplifier is configured with negative feedback between the control unit output terminal and the inverting input.

19. The automotive radar transceiver of claim 15, wherein the second control unit input terminal is configured to set the value of the setting voltage by way of a programmable voltage source.

20. The automotive radar transceiver of claim 15, wherein the control unit output terminal is coupled to a first terminal of a feedback resistor and a second terminal of the feedback resistor is coupled to the second control unit input terminal.

* * * * *